United States Patent
Robinson

(10) Patent No.: US 6,615,279 B1
(45) Date of Patent: Sep. 2, 2003

(54) CENTRAL AND DISTRIBUTED SCRIPT SERVERS IN AN OBJECT ORIENTED PROCESSOR ARRAY

(75) Inventor: Jeffrey I. Robinson, New Fairfield, CT (US)

(73) Assignee: IQ Systems, Westborough, MA (US)

( * ) Notice: Subject to any disclaimer, the term of this patent is extended or adjusted under 35 U.S.C. 154(b) by 0 days.

(21) Appl. No.: 09/003,993

(22) Filed: Jan. 7, 1998

Related U.S. Application Data

(60) Provisional application No. 60/036,526, filed on Jan. 29, 1997.

(51) Int. Cl.[7] .................................. G06F 9/44
(52) U.S. Cl. ..................... 709/315; 709/1; 709/201; 709/311; 709/313; 712/28
(58) Field of Search ................. 709/315, 316, 709/1, 400, 311, 201, 310; 712/28–31

(56) References Cited

U.S. PATENT DOCUMENTS

| | | | | |
|---|---|---|---|---|
| 5,283,888 A | * | 2/1994 | Dao et al. | 709/237 |
| 5,303,369 A | * | 4/1994 | Borcherding et al. | 709/104 |
| 5,390,314 A | * | 2/1995 | Swanson | 717/138 |
| 5,398,336 A | * | 3/1995 | Tantry et al. | 707/103 R |
| 5,404,528 A | * | 4/1995 | Mahajan | 709/320 |
| 5,446,841 A | * | 8/1995 | Kitano et al. | 709/213 |
| 5,541,986 A | * | 7/1996 | Hou | 379/201.01 |
| 5,548,756 A | * | 8/1996 | Tantry et al. | 707/10 |
| 5,548,788 A | * | 8/1996 | McGillis et al. | 710/20 |
| 5,572,680 A | * | 11/1996 | Ikeda et al. | 709/243 |
| 5,623,656 A | * | 4/1997 | Lyons | 707/10 |
| 5,634,070 A | * | 5/1997 | Robinson | 712/28 |
| 5,659,547 A | * | 8/1997 | Scarr et al. | 709/224 |
| 5,708,838 A | * | 1/1998 | Robinson | 709/202 |
| 5,717,614 A | * | 2/1998 | Shah et al. | 702/119 |
| 5,774,721 A | * | 6/1998 | Robinson | 709/201 |
| 5,854,930 A | * | 12/1998 | McLain et al. | 370/241 |
| 5,946,383 A | * | 8/1999 | Havens et al. | 379/201.03 |
| 5,956,515 A | * | 9/1999 | Beals et al. | 717/170 |
| 5,991,802 A | * | 11/1999 | Allard et al. | 709/219 |
| 6,021,444 A | * | 2/2000 | Fukasawa | 709/313 |
| 6,047,311 A | * | 4/2000 | Ueno et al. | 709/202 |
| 6,055,363 A | * | 4/2000 | Beals et al. | 709/201 |
| 6,065,083 A | * | 5/2000 | Garcia et al. | 710/107 |
| 6,094,673 A | * | 7/2000 | Dilip et al. | 709/202 |
| 6,181,697 B1 | * | 1/2001 | Nurenberg et al. | 370/390 |
| 6,272,524 B1 | * | 8/2001 | Robinson | 709/201 |
| 6,272,525 B1 | * | 8/2001 | Robinson | 709/201 |
| 6,272,526 B1 | * | 8/2001 | Robinson | 709/201 |
| 6,272,527 B1 | * | 8/2001 | Robinson | 709/201 |
| 6,275,866 B1 | * | 8/2001 | Boulia et al. | 709/315 |
| 6,289,395 B1 | * | 9/2001 | Apte et al. | 709/318 |
| 6,330,716 B1 | * | 12/2001 | Oberhauser | 709/203 |
| 6,424,990 B1 | * | 7/2002 | Robinson | 709/201 |

FOREIGN PATENT DOCUMENTS

JP          09284335 A   * 10/1997   ........... H01L/12/54

OTHER PUBLICATIONS

Schulzrinne, Lennox. "Call Processing Language Requirements." Jul. 30, 1998.*

* cited by examiner

Primary Examiner—St. John Courtenay, III
Assistant Examiner—Lewis A. Bullock, Jr.
(74) Attorney, Agent, or Firm—Gordon & Jacobson, P.C.

(57) ABSTRACT

An object oriented processor array includes a library of functional objects which are instantiated by commands through a system object and which communicate via a high level language. According to the invention, instantiated objects communicate directly with a script server which is programmed to react to data events generated by instantiated objects. One script server may serve several object oriented processor arrays, or an object oriented processor array may have a local script server. The object oriented processor array may be embodied in hardware, software, or a combination of hardware and software. Each functional object may include a discrete hardware processor or may be embodied as a virtual processor within the operations of a single processor. According to one embodiment, the object oriented processor array is formed on a single chip or on a single processor chip and an associated memory chip.

3 Claims, 7 Drawing Sheets

CENTRAL AND DISTRIBUTED SCRIPT SERVERS IN AN OBJECT ORIENTED PROCESSOR ARRAY

This application claims the benefit of provisional application Ser. No. 60/036,526 filed Jan. 29, 1997 for "Object Oriented Processors With Enhanced Application Directed Flexibility".

This application is related to application Ser. No. 08/525,948, filed Sep. 8, 1995 for "Distributed Processing Systems Having A Host Processor And At Least One Object Oriented Processor" and application Ser. No. 08/683,625, filed Jul. 17, 1996 for "Method And Apparatus For Distributed Processing And Rapid ASIC Development", the complete disclosures of which are hereby incorporated by reference herein in their entireties.

This application is also related to co-pending applications Ser. No. 09/004,174 U.S. Pat. No. 6,052,729 for "Event-Reaction Communication Protocol in an Object Oriented Processor Array", and Ser. No. 09/003,684 U.S. Pat. No. 6,567,837 for "Object Oriented Processor Arrays", both filed simultaneously herewith, and the complete disclosures of which are hereby incorporated by reference herein.

BACKGROUND OF THE INVENTION

1. Field of the Invention

The invention relates to object oriented processors and processor systems. More particularly, the invention relates to an object oriented processor or processor system which communicates with a script server. Script servers according to the invention may be centralized or distributed locally.

2. State of the Art

Modern computers permit seemingly simultaneous execution of many operations by interrupting the microprocessor periodically to execute several software threads in turn. For example, as a user types on a keyboard, the input from this peripheral to the microprocessor is seemingly simultaneously displayed by the microprocessor on a video display peripheral. In reality, the microprocessor is interrupted periodically from displaying output on the video display in order to obtain input from the keyboard. It is only because the microprocessor operates at a very high speed that there is an illusion of simultaneity. In a more complex processing system, there may be many threads vying for microprocessor attention at any time. For example, in a desktop multimedia computer, several peripheral devices must be controlled by the microprocessor in a seemingly simultaneous manner in order to produce the proper results and different operations such as displaying video and playing audio must be handled by separate threads. The programming environment in a system having so many threads is incredibly complex. The system software must be written to schedule microprocessor attention to each thread, assign priority to each thread and allow peripherals to interrupt the microprocessor at appropriate times. The system software must then schedule tasks for the microprocessor in response to the interrupts from various peripherals.

In addition to scheduling problems, software in a multi-tasking (multi-threaded) system is difficult to debug. Single stepping techniques cannot be used, since different threads may depend on the results of other threads, and only a single thread can be operational during single stepping.

The handling of interrupts by the microprocessor is determined in part by the bus protocol and in part by the design of the microprocessor itself. Typically, the bus is designed to work with a particular microprocessor or group of microprocessors; and peripheral devices are designed to work with a particular bus. Moreover, each microprocessor-bus system handles interrupts in a different way. This makes it difficult, if not impossible, to adapt program code used on one microprocessor-bus system for use on another.

In order to relieve the host processor from performing every task, multiprocessor systems have been proposed. Some multiprocessor systems are successful in dividing tasks among processors when the tasks are well defined. For example, it is not uncommon to divide tasks between a data processor and a signal processor in systems which deal with signals and data in real time. It is more difficult to divide data processing tasks among several data processors. The operating system must decide which tasks will be performed by which processor and must schedule tasks so that processors do not remain idle while waiting for new tasks or while waiting for other processors to complete tasks so as to provide needed results. Consequently, there has been very little success in developing a general purpose multiprocessor system and there is no standard programming language for programming a multiprocessor system.

U.S. Pat. No. 5,095,522 to Fujita et al. discloses an object-oriented parallel processing system which utilizes "concept objects" and "instance objects". The system utilizes a host processor and a plurality of general purpose processors which are programmed by the host processor. The host user must program (generate concept and instance objects) for each processor before parallel processing can begin. Fujita et al. considers this aspect of their system to be a feature which allows dynamic changes in the functionality of each of the processors. However, this aspect of their system greatly complicates the host processor software.

Similarly, U.S. Pat. No. 5,165,018 to Simor describes a system in which "nodes" are provided with generic configuration rules and are configured at runtime via resource definition messages from the control node. Simor considers this aspect of his system to be an advantage which, among other things, "isolates the hardware from the software" and "allows programs to be written as if they were going to be executed on a single processor." In addition, Simor's system permits programs to be "distributed across multiple processors without having been explicitly designed for that purpose."

Both Fujita et al. and Simor utilize general purpose processors and attempt to isolate the hardware from the software, freeing the programmer to write code as if it were being executed on a single processor. However, as mentioned above, writing multithreaded software for a single processor is very complex. Neither Fujita et al. nor Simor offer any solution for this complexity.

3. Related Inventions

Related application Ser. No. 08/525,948 approaches the problem of distributed processing in a manner which is completely different from that of either Fujita et al. or Simor. The system disclosed in the '948 application utilizes processors which have been pre-programmed with functionality for a specific purpose and thereby integrates hardware with software. The developer chooses specific hardware (object oriented processors) in a manner similar to choosing specific software objects. This approach requires that the developer be very aware of the hardware used in the system, but frees the developer from writing much of the code used to implement the system. Accordingly, the developer need only write a minimal amount of relatively high level code to link the pre-programmed object oriented processors which contain statically stored code for performing specific tasks. This approach is based on the belief that writing and de-bugging code is more time consuming and more expensive than linking together processors which contain pre-written, bug-free code. This approach enables rapid system development, relieves the host processor of many scheduling tasks, simplifies de-bugging, enables cross-platform support, allows software emulation of hardware devices, as well as providing other advantages.

According to the '948 application, object oriented processors communicate with each other and/or with the host processor via the exchange of high level messages. This earliest implementation of the communication protocol required that the host poll at least some of the object oriented processors (i.e. those responsible for processing input data) to determine the availability of data. This was eventually found to detract from the goal of simple coding as the host code had to be written in a manner that would scan all possible input sources on a frequent basis. It was eventually decided that this polling created an undesirable overhead and coding complication. Since many of the originally developed object oriented processors operated in real time, the polling scan rate could be high and thus the overhead could be substantial. In addition, the early communication protocol did not provide information about the source of the data. This was instead derived by specific information requests by the host. Thus, several message exchanges might have been required before both data and source were determined.

Related application Ser. No. 08/683,625 discloses a distributed processing system one or more object oriented processors are embodied as a collection of components on a single ASIC chip. This related application includes an enhanced communication language where the host need not poll the object oriented processors and where messages from one processor to another include source and destination addresses. This communication protocol can be said to be "event driven".

SUMMARY OF THE INVENTION

As used herein, the term "object oriented processor array" means a collection of object oriented processors where each object oriented processor incorporates a separate hardware processor, or a collection of object oriented processors where each object oriented processor is embodied as a virtual processor sharing the same hardware processor, or any combination of discrete hardware processors and virtual processors.

It is therefore an object of the invention to provide an object oriented processor array with enhanced post-manufacture configurability.

It is an additional object of the invention to provide an object oriented processor array which utilizes an enhanced communication protocol which conserves bandwidth and allows the developer/user to choose a level of coding simplicity in exchange for object latency.

In accord with these objects which will be discussed in detail below, an object oriented processor array of the present invention includes a readable memory containing a library of configurable (programmable) functions (also referred to as objects) and a writable memory in which objects are instantiated and configured. More specifically, the object oriented processor array includes a system functionality (system object) which is automatically instantiated in writable memory at power-up, which calls other objects to be instantiated in writable memory in response to commands from a host processor or a boot ROM, and which maintains an active task list and other information about instantiated objects. The object oriented processor array according to the invention further includes a communications interface, an input message processor, and an output message processor. The communications interface allows the object oriented processor array to communicate with other object oriented processor arrays and/or with a host processor or script server. The output message processor preferably includes an output flow manager for handling messages from processor objects in the array and a central output registry for queuing messages. According to a presently preferred embodiment, the object oriented processor array is embodied as a virtual machine which is formed from software which runs on a microprocessor. Therefore, the software which embodies the object oriented processor array is provided with a timing kernel which simulates parallelism and a memory manager which allocates memory to objects when they are instantiated.

During operation, a message to a particular instantiation of an object is parsed by the input message processor which scans the active task list name table to find the index to the active task list the pointer to the object instantiation addressed. The object receives the message from the input message processor and the index. The object uses the index and the active task list data space table to find which instantiation of itself is being addressed. Messages from an instantiation of an object are placed in the output message header part of its RAM and a request for registration is sent to the central output registry. The output registry maintains a queue of pointers to messages in output message header parts. The queue is scanned by one or more output flow managers which form output messages from the information held in the output message header parts.

According to one embodiment of the invention, one or more object oriented processor arrays are coupled to a central script server or host processor. Messages which result from data events in any of the processor objects are sent to the central script server for processing. The central script server parses the messages it receives from processor objects and executes a script which has been written for this type of data event. The script usually results in the sending of a message to another processor object on the same array or on a different array than the array containing the processor object having the data event. The flow of messages is preferably based on an event-reaction architecture as described in co-pending Ser. No. 09/004,174.

According to another embodiment, one or more object oriented processor arrays are provided with local, internal script servers. In this "distributed scripting" embodiment, communications are controlled according to the event-reaction protocol by providing the output message processor with additional functionality to register and queue data events and an event script look up table to determine which events relate to internal messages. The input message processor is provided with additional functionality to queue and buffer messages destined for objects in the array.

According to other preferred aspects of the invention, a high level language is provided for communication between object oriented processors and a host processor during set-up and during operation. The high level language according to the invention includes support for the event-reaction protocol, an efficient addressing scheme, better use of bandwidth and simplified host parsing. According to a presently preferred embodiment, the high level language messages are exchanged in packets of variable length with a well defined header. The header includes addressing information, an indication of the type of message which follows, an indication of the method or data type, and an indication of the length of the remaining data in the packet. The high level language is self-aligning, simple, and robust.

As mentioned above, the object oriented processor arrays according to the invention are embodied in many alternative constructions including running software on a microprocessor, field programmable gate arrays, multiple microprocessors, and other hardware devices.

Additional objects and advantages of the invention will become apparent to those skilled in the art upon reference to the detailed description taken in conjunction with the provided figures.

BRIEF DESCRIPTION OF THE APPENDICES

"The compact disc contains Appendix A, stored as file app-a.txt having 3.987 bytes, Appendix B, stored as file app-b.txt having 21,633 bytes, and Appendix C, stored as file app-c.txt having 10,557 bytes, all of which was created on Dec. 13, 2002.

Appendix A is an exemplary source code listing for the timing kernel which includes Main1001.c, and Timer2.c;

Appendix B is an exemplary source code listing for the communications interface and message processors which includes Globals.h, Comms.c, Imsgproc.c, and Omsgproc.c; and Appendix C is an exemplary source code listing for an exemplary processor object (Enc4.c).

DETAILED DESCRIPTION OF THE PREFERRED EMBODIMENTS

Figure 1:
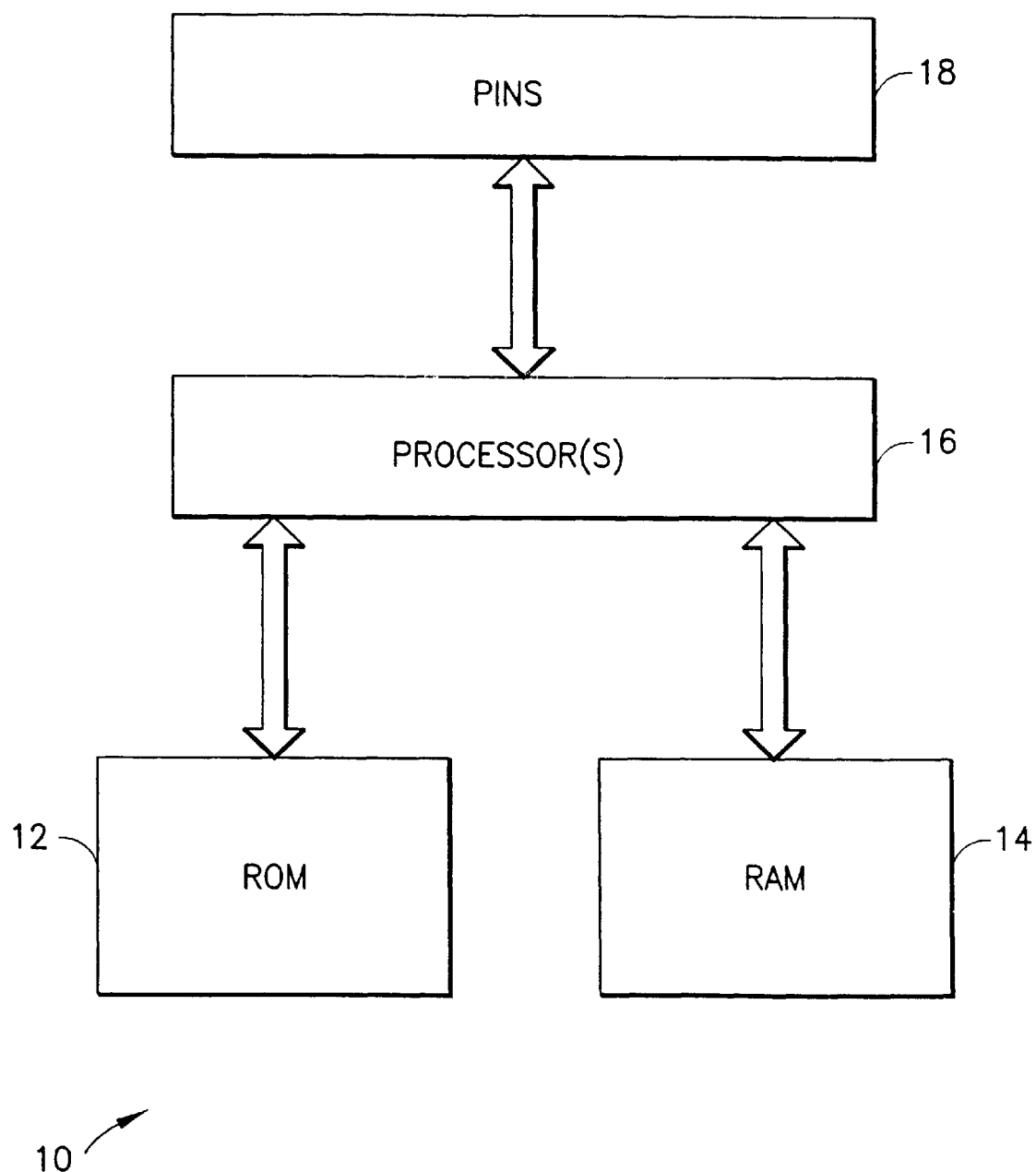
FIG. 1 is a schematic block diagram of the major hardware components of an object oriented processor array according to the invention.

Referring now to FIG. 1, an object oriented processor array 10 according to a presently preferred embodiment of the invention includes a readable memory 12, a writable memory 14, one or more programmable processors 16 coupled to the memory 12 and 14, and a real world interface such as a number of pins 18 which are coupled to the processor(s) 16. As shown and described in further detail below, one embodiment of the invention resides on a single chip which includes a single general purpose microprocessor, RAM and ROM and which has a number of pins. Those skilled in the art will appreciate, however, that the functional aspects of the invention may be embodied using many different types of hardware and/or software.

Figure 2:
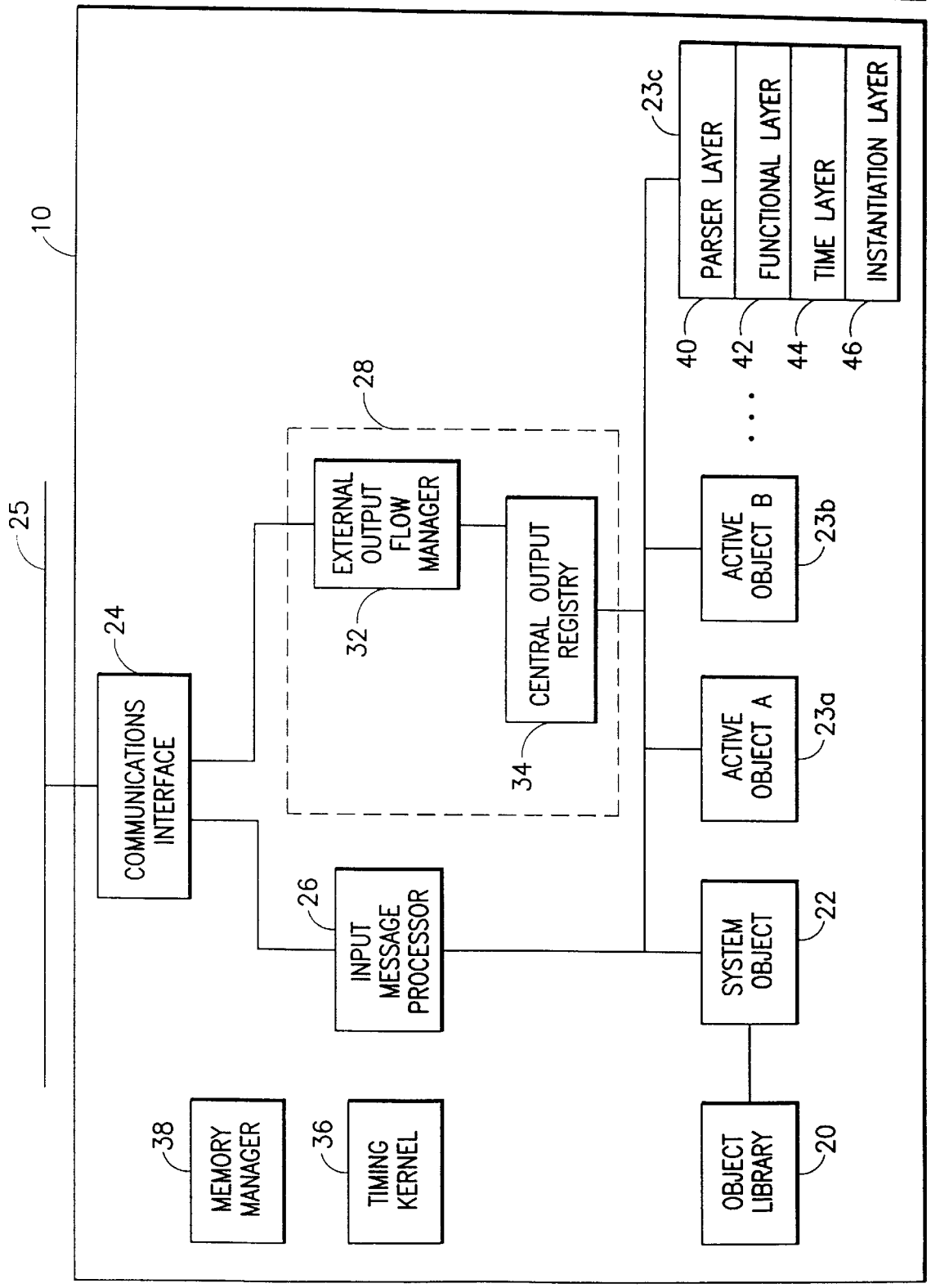
FIG. 2 is a schematic block diagram of the major functional components of an object oriented processor array according to the invention.

Turning now to FIG. 2, and with reference to FIG. 1, the readable memory 12 contains a library 20 of configurable (programmable) functions (also referred to as objects) which are instantiated and configured in the writable memory 14 as described in detail below. More specifically, the object oriented processor array 10 includes a system object 22 which is automatically instantiated in writable memory at power-up, which calls other objects from the library 20 to be instantiated in writable memory in response to commands from a host processor or a boot ROM as described in more detail below. Once an object has been instantiated, it appears as an active object, e.g. 23a, 23b, 23c, in the processor array 10. The object oriented processor array further includes a communications interface 24, an input message processor 26, and an output message processor 28. The communications interface 24 allows the array of active objects 23a-23c to communicate with other object oriented processor arrays and/or with a host processor or script server via a communications link or bus 25 (which may be in the form of a physical bus, a multi-ported memory or even a radio link). The communications interface also allows the system object 22 to receive commands from a host or boot ROM. The input message processor 26 is responsible for routing and basic syntax parsing of incoming messages. Once the message is received and deemed syntactically correct, it is routed to the parser layer of the addressed object as discussed below. The output message processor 28 preferably includes an external output flow manager 32 for handling messages from active objects in the array 10 to processors external of the array 10, and a central output registry 34 for queuing messages. All input to the output message processor 28 is through the central output registry 34. As described in more detail below, upon the occurrence of an event within an object, the object calls the central registry 34 and provides a handle to a standard structure which is entered into the output queue. The output queue is scanned by the flow managers which look for information on the output queue and the priority the object has been assigned, if any. Once a flow manager determines which object has subsequent use of the port, it constructs a message using information in the standard structure which determines the message type (e.g. data event, command ack, etc.), the name of the object that originated the message, the type or source of the data, and any data associated with the message which is derived by referencing a pointer. The newly composed message is then sent to the output port and transmitted.

As mentioned above, according to one embodiment, the object oriented processor array 10 is embodied as a virtual machine which is formed from software which runs on a microprocessor. Therefore, the software which embodies the object oriented processor array 10 is provided with a timing kernel 36 which simulates parallelism and a memory manager 38 which allocates memory to objects when they are instantiated. It will also be appreciated that when the object oriented processor array 10 is embodied as a virtual machine, the interconnections among the elements shown in FIG. 2 are not physical connections, but rather indicative of the functional relationships among the elements.

Figure 3:
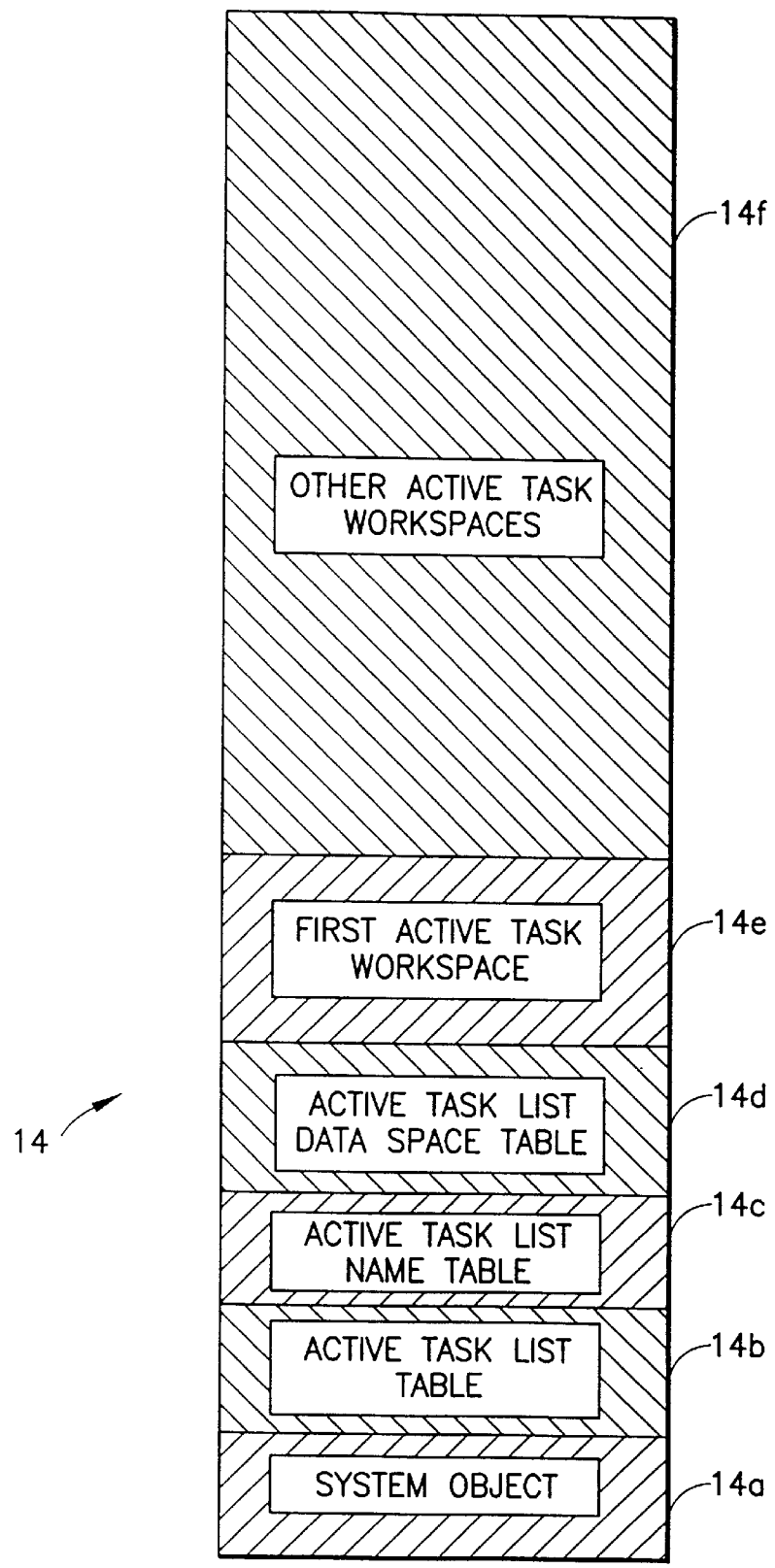
FIG. 3 is a schematic memory map of the writable memory area in the object oriented processor array of FIGS. 1 and 2.

Referring now to FIGS. 2 and 3, each object, e.g. 23c, includes a parser layer 40, a functional layer 42, a time layer 44, and an instantiation layer 46. The parser layer contains the intelligence to interpret the vocabulary pertinent to the particular object and to perform tasks which can be performed immediately. As mentioned above, each object has a certain predefined functionality which is configurable. The vocabulary for each object, therefore, will be governed somewhat by the functionality which the object contains and will also include some general purpose vocabulary for communication. Examples of how the vocabulary of each object may be different is shown in related application Ser. No, 08/525,948. The parser layer is the means by which an instantiated object is initialized and configured, and the means by which the object receives messages. The functional layer 42 contains all of the intelligence needed to carry out the predefined functionality of the object and is preferably divided into a runtime layer and a background layer. The runtime layer contains the functionality which needs to be executed on a continual basis and the background layer contains the functionality for relatively low priority tasks. For example, if the object is coupled to an input device, scanning the input device would be part of the runtime layer. The functions performed in the background layer usually take a long time to execute such as low speed communications dialog with a device socket. The time layer 44 participates in the scheduling of the runtime layer by providing information to the system object 22 about the dynamic performance and behavior of the particular object as described more fully below. The instantiation layer 46 performs the tasks needed to instantiate the object when called by the system object as described more fully below.

As mentioned above, all of the objects, e.g. 23a–23c, are preferably stored in ROM. The system object 22 is also preferably stored in ROM and is automatically instantiated when the processor array 10 is powered on. The instantiation of the system object 22 includes reserving a portion 14a of RAM 14 for itself and reserving portions of RAM 14 for an active task list table 14b (function pointers to instantiated objects), an active task list name table 14c (the names of the instantiated objects), and an active task list data space 14d (pointers to the allocated memory blocks for each instantiated object). The system object 22 is similar to other objects but handles global methods and functions which are common to all objects (e.g., turning exception on/off, returning shell status, etc.—"shell status" includes, e.g., the number of events pending, the number of acknowledgements pending, the number of communication errors, etc.) and essentially consists of a parser layer only. The primary function of the system object is calling other objects to be instantiated.

The initialization, configuration, and general operation of the object oriented processor array is described in detail in co-pending Ser. No. 09/003,684 U.S. Pat. No. 6,567,837 entitled "Object Oriented Processor Arrays". In addition, many of the features of initialization, configuration, and general operation can be gleaned from Appendices A–C attached hereto.

Figure 4:
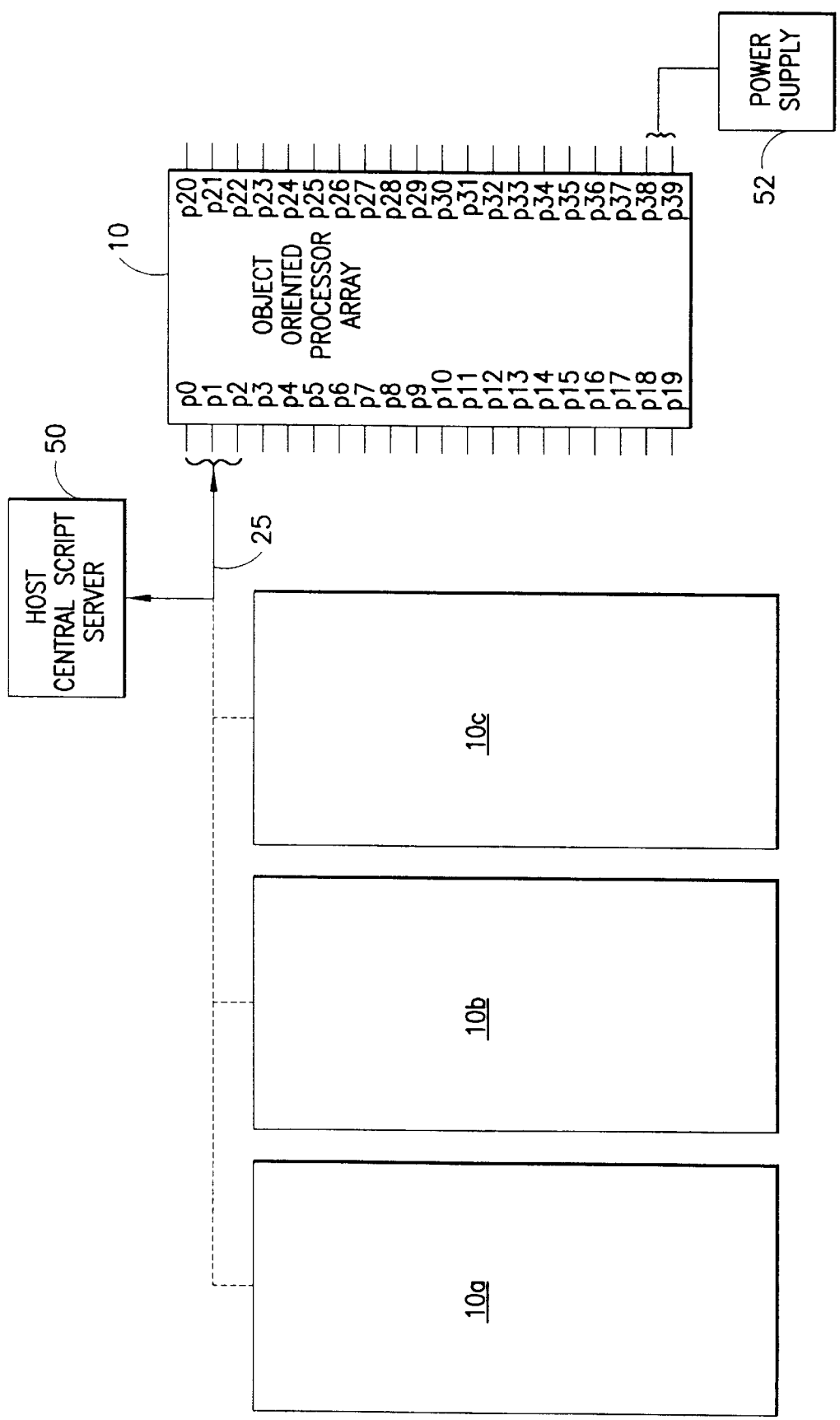
FIG. 4 is a schematic block diagram of an object oriented processor array according to the invention coupled to a central script server and a power supply.

Turning now to FIG. 4, a presently preferred embodiment of the object oriented processor array 10 is contained on a single chip having a plurality of pins, e.g., p0 through p39. Three pins, e.g. p0, p1, and p2 are preferably reserved for a communications link with a central script server 50 and additional object oriented processor arrays, e.g. 10a–10c, via a network link 25; and two pins, e.g. p38 and p39 are preferably reserved for connection to a DC power source 52. According to the presently preferred embodiment, the three pins are used to implement the communications network described in co-owned, co-pending application number 08/645,262, filed May 13, 1996, the complete disclosure of which is incorporated by reference herein. In some instances, however, it may be advantageous to provide discrete point-to-point links between the host 50 and each array 10, 10a–10c, e.g., when the arrays are physically removed from each other by substantial distance, when the arrays are operating at substantially different speeds, or when only one array is used. In these situations, only two pins will be needed to support the link and one may use the point-to-point communication methods disclosed in co-owned, co-pending application number 08/545,881, filed Oct. 20, 1995, the complete disclosure of which is incorporated by reference herein. It should also be noted that the script server may also be coupled to other conventional microprocessors and/or peripheral devices to create a system which includes both distributed object oriented processing with traditional microprocessor systems.

According to the invention, the central script server 50 may be used to configure the object oriented processor arrays 10, 10a–10c utilizing a high level command language and is used to communicate with the object oriented processor arrays during normal operations. According to one embodiment of the invention, all messages generated by an object oriented processor array are sent to the script server for processing. More particularly, when an instantiated object in one of the arrays 10, 10a–10c has data to send to another object, the data is first sent to the script server 50 and a program running on the script server determines the destination for the data. The program on the script server may also manipulate the data before sending it on to another object.

A presently preferred embodiment of a messaging language has the following syntax: <array address|message type><object name><method/data type>(<data length><data>. . . <data>). The <> indicate bytes, the () are literal characters and the . . . shows that the number of data bytes may vary. The array address is five bits and for point to point communications, the array address is set to zero. The message type is three bits and presently six message types are defined. These include (1) exception, (2) data acknowledgement, (3) data event, (4) command acknowledgement, (5) polled response, and (6) command event. The object name is eight bits and is presently limited to ASCII characters @ through Z. The method/data type field is eight bits and is limited to ASCII characters a through z. This field is interpreted as a method when the message type is a command event or a command acknowledgement. There are presently five data types defined: (z) signed character, (y) unsigned character, (x) signed integer, (w) unsigned integer, and (v) floating point number. See, e.g., Appendix B, of the compact disc Globals.h, lines 22–35 and 55–69. The data length is eight bits and does not include the left and right parenthesis or the data length itself. The acknowledgement of commands is mandatory and the acknowledgement must echo the address fields of the command. The parsing of messages in this form is shown for example in Appendix B. Comms.c, lines 62–233.

Figure 5:
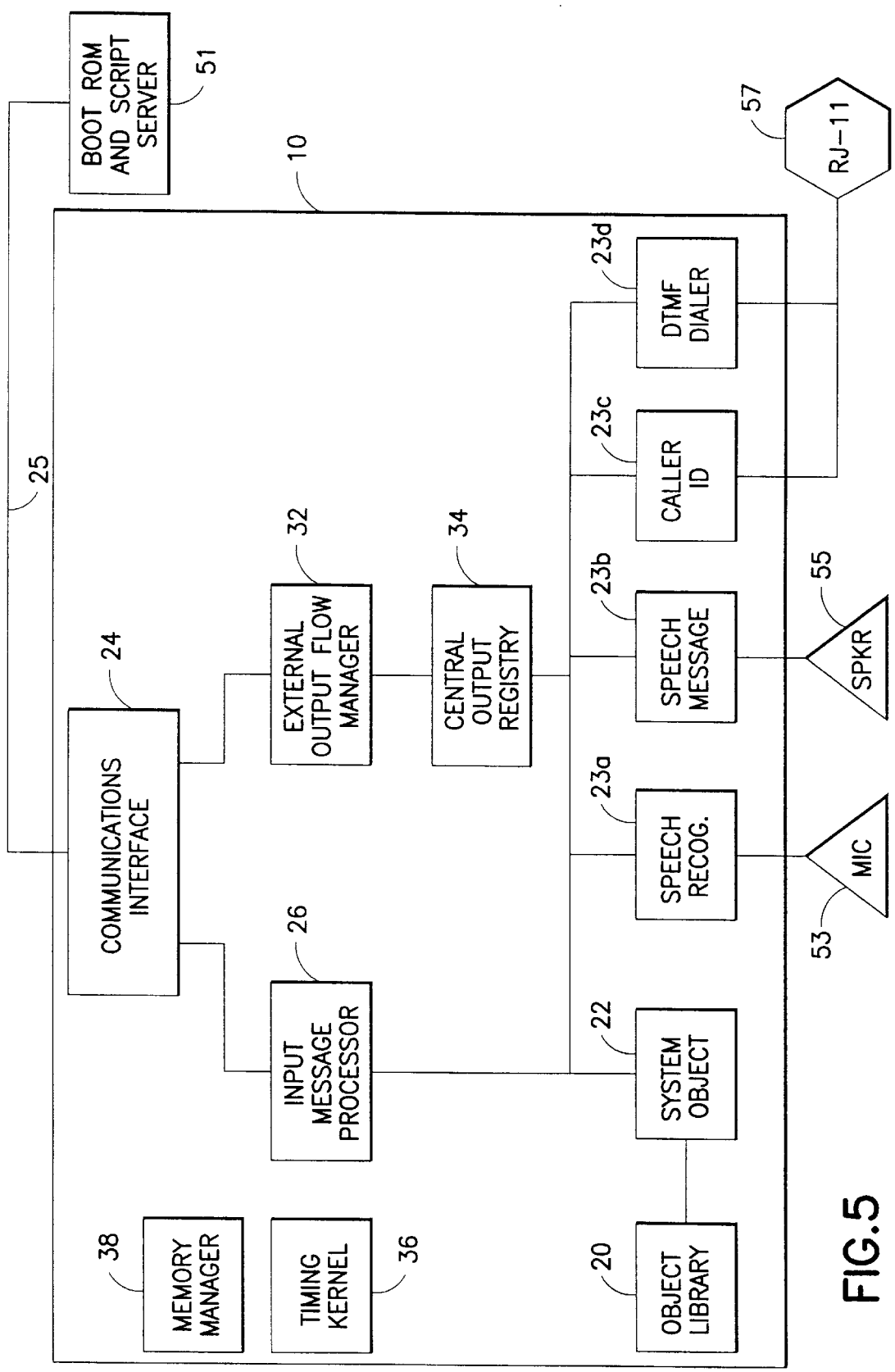
FIG. 5 is a schematic block diagram of an implementation of an object oriented processor array to control a "smart telephone"

Turning now to FIG. 5, an exemplary application of an object oriented processor array 10 is a "smart telephone accessory". In this application, the object oriented processor array 10 is provided with a speech recognition processor object 23a, a speech messaging processor object 23b, a caller ID processor object 23c, and a DTMF dialer 23d. Each of these processor objects is contained in the object librtary 20 and is self-instantiated in response to calls from the system object 22 which receives commands from a boot ROM 51 as described above. It will also be appreciated that the boot ROM also includes commands to assign pins to the objects 23a–23d. According to this application, two pins assigned to the speech recognition object 23a are coupled to an external microphone 53, and two pins assigned to the speech message object 23b are coupled to an external speaker 55. In addition, two pins assigned to the caller ID object 23c and the DTMF dialer object 23d are coupled to an RJ-11 plug or jack. The smart telephone accessory application is designed to respond to voice commands by dialing phone numbers associated with particular recognized names. In addition, this application is also designed to respond to incoming calls by announcing the name of the person calling. In order to accomplish these functions, the script server 51 is provided with scripts which are executed in response to a data event from either the speech recognition object 23a or the caller ID object 23c. An example of a script executed in response to a data event from the speech recognition object 23a is shown below in Table 1.

TABLE 1

| SCRIPT | COMMENTS |
| --- | --- |
| switch(DE__ObjName) { | |
| switch(DE__Src) { | script server looks up recognized name in database |
| ... | |
| case HOME: | script server finds this script attached to the name HOME |
| send("{dD(425,3657)"}; | send a command to the DTMF dialer to dial 425-3657 |
| send("{mP(A15A24A19)"}; | send a command to the speech message to play messages A15, A24, A19 |
| break; | |
| ... | |
| } | |
| ... | |

As shown in Table 1, when the speech recognition object registers a data event, the script server looks up the recognized name in a database (the database may reside on the script server or may be provided in an object in the array) to find the telephone number associated with the name, in this case "HOME". The script server then sends a command to the DTMF dialer to dial the number associated with HOME in the database. In addition, the script server sends a command to the speech message object to play three messages, e.g. "I am", "calling", "home".

Another example of a script for this application is shown below in Table 2.

TABLE 2

| SCRIPT | COMMENTS |
| --- | --- |
| person=lookup(DE__Buff); | script server looks up number in database to find person's name |
| sprintf(msg,"{mP&(%s)",person; | constructs message to play |
| send(msg); | sends message to speech message object |

As shown in Table 2, when the caller ID object registers a data event, the script server looks up the phone number in a database to determine the caller's name. The script server constructs a message to play, e.g. "Jeff is calling", and sends the message to the speech message object.

Figure 6:
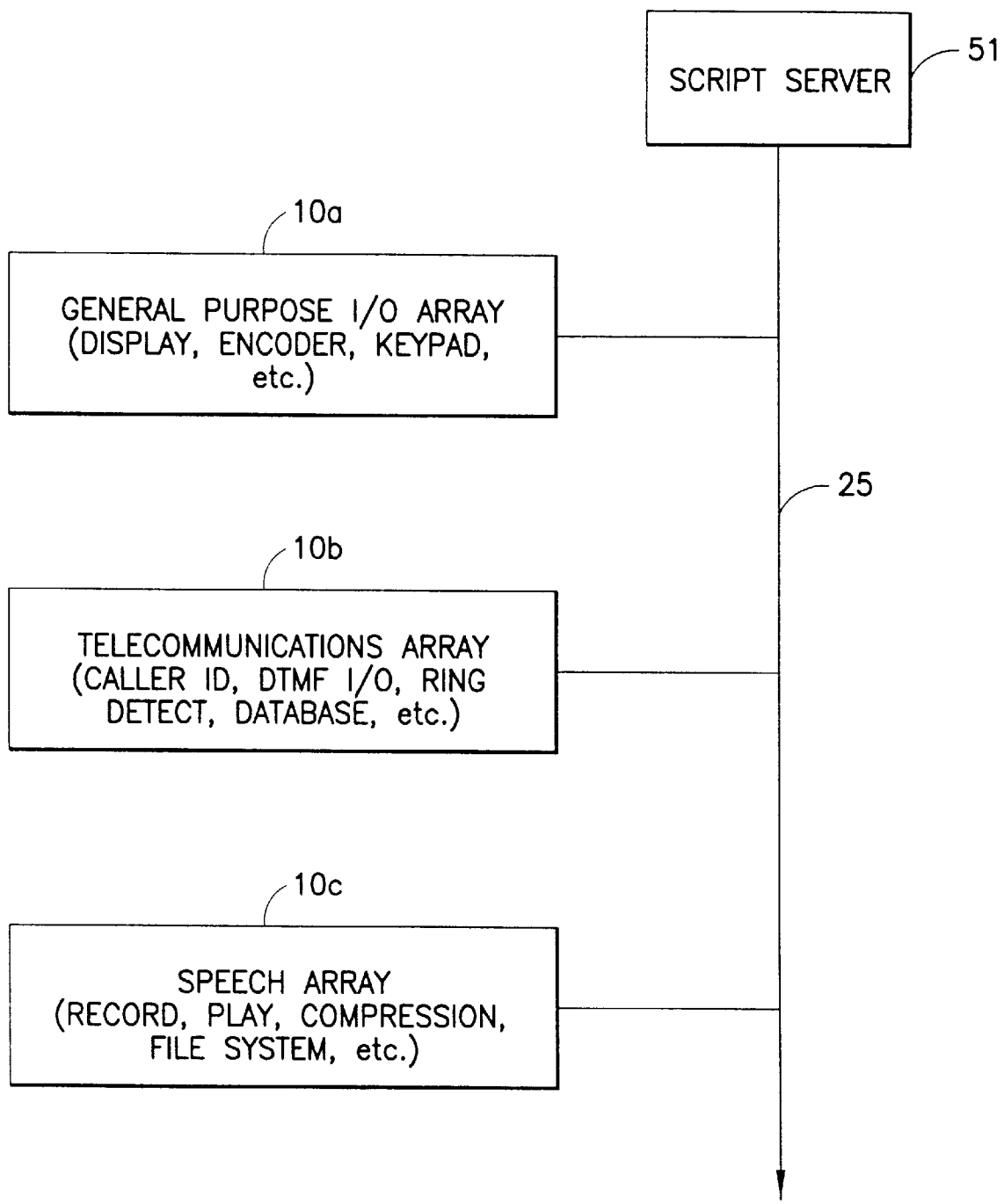
FIG. 6 is a schematic block diagram of another implementation of an object oriented processor array to control a "smart telephone"

In the example shown in FIG. 5, a single object oriented processor array 10 is provided with a library of functions specifically designed for the "smart telephone" application. According to the invention, applications such as the smart telephone may be created by linking together several object oriented processor arrays, each of which has a library of functionality which may serve many different applications. For example, as shown in FIG. 6, another smart telephone application may be created using three object oriented processor arrays 10a, 10b, 10c, each of which is coupled via a communications bus 25 to a central script server 51. In this example, the array 10a is a general purpose Input/Output array which controls displays, encoders, keypads, etc. The array 10a may be used in many different applications. In this application, the array 10a may be used to display Caller ID information in response to a command from the script server 51, to accept telephone keypad input and forward that input to the script server, to receive encoder position information and forward it to the script server to select functions of the application, etc. The array 10b is a general purpose telecommunications array which includes processors for dealing with various types of telecommunications data such as Caller ID, DTMF tone generation and tone interpretation, off hook and ring detection, etc. The array 10b may be used in many different types of telecommunications applications such as voicemail systems, remote operation of equipment by telephone keypad, etc. In this "smart phone" operation, the array 10b will provide Caller ID, DTMF tone interpretation, ring detect and off hook information to the script server and will generate DTMF tones in response to commands from the script server. The speech array 10c may be used in any application which calls for recording and playing back spoken words. In the "smart phone" example, this array responds to commands from the script server to speak the names of callers, etc. FIG. 6 shows the communication bus 25 as "open ended". This is intended to indicate that the system shown in FIG. 6 is expandable and that additional object oriented processor arrays may be added to add additional features. When additional object oriented processor arrays are added, additional scripts will also be added to the script server 51 to allow the object oriented processor arrays to interact with each other. Examples of functions provided by additional object oriented processor arrays which might be added to the system shown in FIG. 6 include: time and date display, call blocking, voicemail boxes, automatic redialing, a personal computer interface, speech recognition, an email interface (converts voicemail into email and sends it), a printer interface, a speaker phone, a forward to pager function (forwards caller ID, and/or email to pager). Those skilled in the art will appreciate that such additional functions may be provided by one or more object oriented processor arrays and that additional scripts for the functions will be loaded into the script server.

Figure 7:
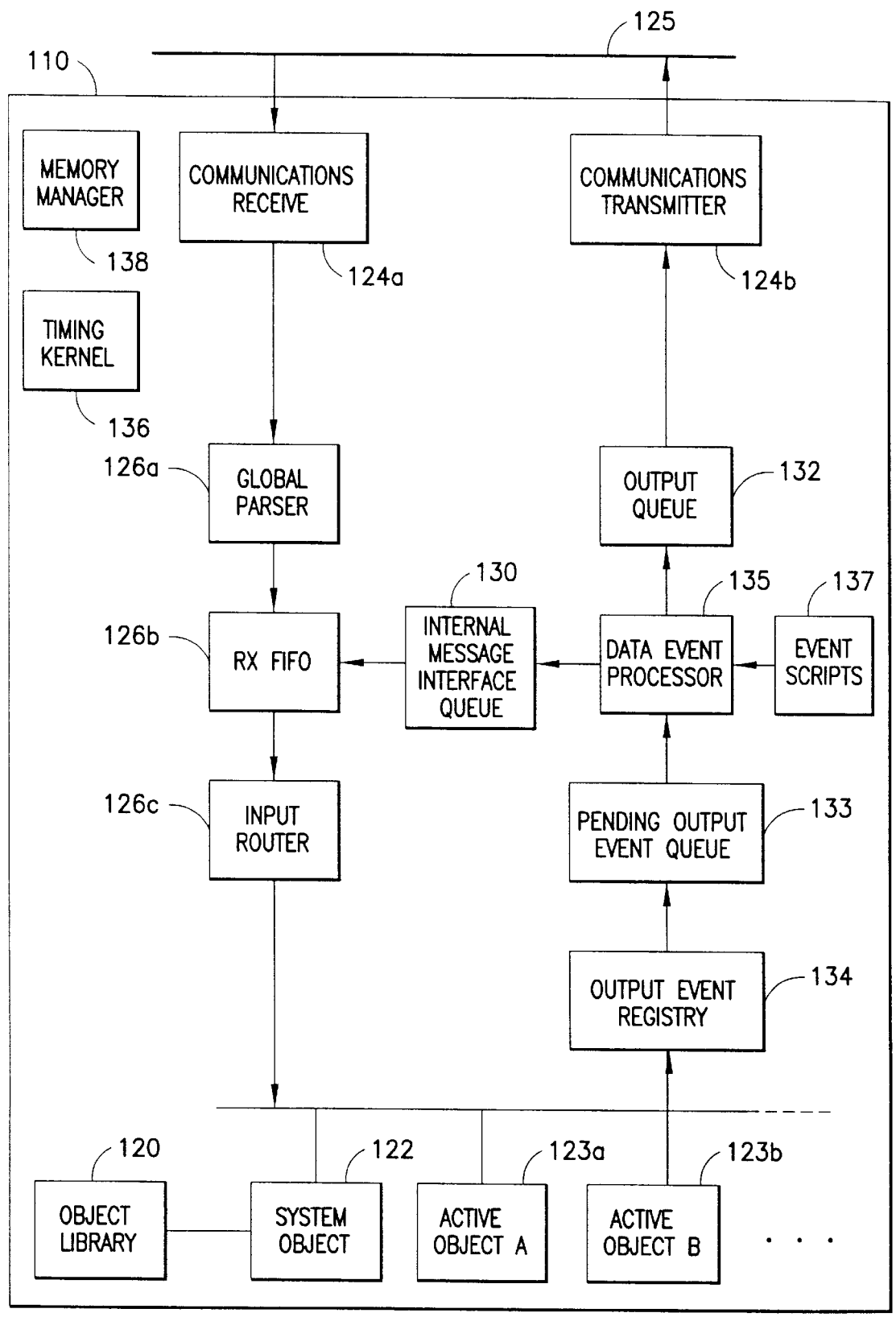
FIG. 7 is a schematic block diagram of the major functional components of an object oriented processor array having a distributed (local) script server.

According to another embodiment of the invention, seen in FIG. 7, one or more object oriented processor arrays are provided with local, internal script servers and no central script server or host processor is needed. In this "distributed scripting" embodiment, communications are controlled by providing the output message processor with additional functionality to register and queue data events and an event script look up table to determine which events relate to internal messages. The input message processor is provided with additional functionality to queue and buffer messages destined for objects in the array.

More particularly, an object oriented processor array 110 according to the invention has many similar components as the array 10 described above and the similar components are labelled with similar reference numerals incremented by 100. The array 110 includes an object library 120, a system object 122, and, after initialization, a number of active objects 123a, 123b, etc. The array also has a communications receiver 124a and a communications transmitter 124b, both of which are coupled to an external bus or link 125 for coupling the array 110 to other similar arrays. Messages bound for objects within the array are routed by an input router 126c which receives the messages from a buffer 126b. The buffer 126b buffers messages received from the global input parser 126a and the internal message interface queue 130. Messages which originate external of the object oriented processor array are received by the communications receiver 124a and passed to the global parser 126a. Messages which originate within the array are received by the internal message interface queue 130 which receives the messages from the data event processor 135. The data event processor 135 also provides input to the output queue 132 for transmission to objects external of the array by the transmitter 124b. The data event processor 135 receives input from the pending output event queue 133 and a programmable table of event scripts 137. As in the first embodiment, messages from objects in the array are registered in an output registry 134.

According to this embodiment, the source address of a data event is read by the data event processor 135 from the pending output event queue 133 and used to look up a script associated with that address in the script table 137. The script is executed by the data event processor 135 and typically results in the generation of a message. The message generated by the script may be destined to an object within the array or an object external of the array. In the former situation, the message is passed to the internal message interface queue. In the latter situation, the message is sent to the output queue 132. Thus, the data event processor and the script table function as a local script server within the array and there is no need for a central script server. It should be noted, however, that a central script server may be used with the array 110. Messages will be sent to the central script server when no script for the data event appears in the script table, or when the script associated with the data event causes a message to be sent to the central script server.

This embodiment of the object oriented processor array, like the first embodiment, may be embodied on a single chip using one or more microprocessors with associated RAM and ROM. When so embodied, the array 110 will also include a memory manager 138 and a timing kernel 136. It will be appreciated that the script table may be stored in either RAM or ROM and may be initialized (programmed) at startup by either a boot ROM or by a host processor.

There have been described and illustrated herein several embodiments of an object oriented processor array with central and distributed script servers. While particular embodiments of the invention have been described, it is not intended that the invention be limited thereto, as it is intended that the invention be as broad in scope as the art will allow and that the specification be read likewise. Thus, while a particular microprocessor has been disclosed with reference to the presently preferred embodiment, it will be appreciated that other off the shelf or custom microprocessors could be utilized. Also, while specific software has been shown, it will be recognized that other software code could be used with similar results obtained. It will therefore be appreciated by those skilled in the art that yet other modifications could be made to the provided invention without deviating from its spirit and scope as so claimed.

What is claimed is:

1. A distributed processing system, comprising:

a) a plurality of object oriented processors, each having a predefined functionality, each capable of generating at least one data event, and each having an address;

b) a script server coupled to each of said object oriented processors, said script server containing a plurality of executable scripts, each being linked to one of said addresses, wherein upon the generation of a data event by one of said object oriented processors, said script server executes the script associated with the address of the object oriented processor which generated the data event.

2. A distributed processing system according to claim 1, wherein:

at least one of said scripts, when executed, results in said script server sending a command to one of said object oriented processors.

3. A distributed processing system according to claim 1, wherein:

at least one of said scripts, when executed, results in said script server sending data to one of said object oriented processors.

* * * * *